US011112447B1

(12) United States Patent
Martens

(10) Patent No.: US 11,112,447 B1
(45) Date of Patent: Sep. 7, 2021

(54) METHOD FOR DIFFERENTIAL/COMMON-MODE NOISE FIGURE MEASUREMENTS

(71) Applicant: ANRITSU COMPANY, Morgan Hill, CA (US)

(72) Inventor: Jon S Martens, San Jose, CA (US)

(73) Assignee: ANRITSU COMPANY, Morgan Hill, CA (US)

(*) Notice: Subject to any disclaimer, the term of this patent is extended or adjusted under 35 U.S.C. 154(b) by 2 days.

(21) Appl. No.: 16/438,240

(22) Filed: Jun. 11, 2019

Related U.S. Application Data

(60) Provisional application No. 62/683,603, filed on Jun. 11, 2018.

(51) Int. Cl.
*G01R 31/26* (2020.01)
*G06F 17/13* (2006.01)
*G01R 31/28* (2006.01)

(52) U.S. Cl.
CPC ..... *G01R 31/2646* (2013.01); *G01R 31/2841* (2013.01); *G06F 17/13* (2013.01)

(58) Field of Classification Search
CPC ............ G01R 31/2646; G01R 31/2626; G01R 31/2616; G01R 31/2841; G06F 17/13
See application file for complete search history.

(56) References Cited

U.S. PATENT DOCUMENTS

| | | | | |
|---|---|---|---|---|
| 3,718,857 A | * | 2/1973 | Bernard | G01R 31/26 324/617 |
| 4,556,841 A | * | 12/1985 | Carlson | G01R 27/28 324/614 |
| 4,669,051 A | * | 5/1987 | Barr, IV | G01R 23/16 324/76.13 |
| 5,801,525 A | | 9/1998 | Oldfield | |
| 5,812,039 A | | 9/1998 | Oldfield | |
| 5,909,192 A | | 6/1999 | Finch | |
| 5,977,779 A | | 11/1999 | Bradley | |
| 6,049,212 A | | 4/2000 | Oldfield | |

(Continued)

FOREIGN PATENT DOCUMENTS

KR       100414362 B1 *  1/2004

OTHER PUBLICATIONS

Akmal, M. et al., "An Enhanced Modulated Waveform Measurement System for the Robust Characterization of Microwave Devices under Modulated Excitation", Proceedings of the 6th European Microwave Integrated Circuits Conference, © 2011, Oct. 2011, Manchester, UK, pp. 180-183.

(Continued)

*Primary Examiner* — Patrick Assouad
*Assistant Examiner* — Demetrius R Pretlow
(74) *Attorney, Agent, or Firm* — Tucker Ellis LLP

(57) ABSTRACT

A system for measuring noise characteristics of a device under test (DUT) includes one or more computers and memory, a first receiver connected to a first port of the DUT, a second receiver connected to a second port of the DUT, the second receiver being synchronized with the first receiver and a non-transitory computer readable storage medium having instructions thereon that when read and executed by the one or more computers causes the system to transmit signals to the DUT, receive signals from the DUT, and characterize noise associated with the DUT within the received signals.

20 Claims, 4 Drawing Sheets

(56) References Cited

U.S. PATENT DOCUMENTS

| | | | |
|---|---|---|---|
| 6,163,223 A * | 12/2000 | Kapetanic | G01R 23/20 |
| | | | 331/14 |
| 6,291,984 B1 | 9/2001 | Wong | |
| 6,316,945 B1 | 11/2001 | Kapetanic | |
| 6,331,769 B1 | 12/2001 | Wong | |
| 6,496,353 B1 | 12/2002 | Chio | |
| 6,504,449 B2 | 1/2003 | Constantine | |
| 6,509,821 B2 | 1/2003 | Oldfield | |
| 6,525,631 B1 | 2/2003 | Oldfield | |
| 6,529,844 B1 | 3/2003 | Kapetanic | |
| 6,548,999 B2 | 4/2003 | Wong | |
| 6,650,123 B2 | 11/2003 | Martens | |
| 6,665,628 B2 | 12/2003 | Martens | |
| 6,670,796 B2 | 12/2003 | Mori | |
| 6,680,679 B2 | 1/2004 | Stickle | |
| 6,700,366 B2 | 3/2004 | Truesdale | |
| 6,700,531 B2 | 3/2004 | Abou-Jaoude | |
| 6,714,898 B1 | 3/2004 | Kapetanic | |
| 6,766,262 B2 | 7/2004 | Martens | |
| 6,832,170 B2 | 12/2004 | Martens | |
| 6,839,030 B2 | 1/2005 | Noujeim | |
| 6,882,160 B2 | 4/2005 | Martens | |
| 6,888,342 B2 | 5/2005 | Bradley | |
| 6,894,581 B2 | 5/2005 | Noujeim | |
| 6,917,892 B2 | 7/2005 | Bradley | |
| 6,928,373 B2 | 8/2005 | Martens | |
| 6,943,563 B2 | 9/2005 | Martens | |
| 7,002,517 B2 | 2/2006 | Noujeim | |
| 7,011,529 B2 | 3/2006 | Oldfield | |
| 7,016,024 B2 | 3/2006 | Bridge | |
| 7,019,510 B1 | 3/2006 | Bradley | |
| 7,054,776 B2 | 5/2006 | Bradley | |
| 7,068,046 B2 | 6/2006 | Martens | |
| 7,088,111 B2 | 8/2006 | Noujeim | |
| 7,108,527 B2 | 9/2006 | Oldfield | |
| 7,126,347 B1 | 10/2006 | Bradley | |
| 7,173,423 B2 | 2/2007 | Buchwald | |
| 7,284,141 B2 | 10/2007 | Stickle | |
| 7,304,469 B1 | 12/2007 | Bradley | |
| 7,307,493 B2 | 12/2007 | Feldman | |
| 7,400,129 B1 * | 7/2008 | Prather | G01R 23/20 |
| | | | 324/76.19 |
| 7,509,107 B2 | 3/2009 | Bradley | |
| 7,511,577 B2 | 3/2009 | Bradley | |
| 7,521,939 B2 | 4/2009 | Bradley | |
| 7,545,151 B2 | 6/2009 | Martens | |
| 7,683,602 B2 | 3/2010 | Bradley | |
| 7,683,633 B2 | 3/2010 | Noujeim | |
| 7,705,582 B2 | 4/2010 | Noujeim | |
| 7,746,052 B2 | 6/2010 | Noujeim | |
| 7,764,141 B2 | 7/2010 | Noujeim | |
| 7,872,467 B2 | 1/2011 | Bradley | |
| 7,924,024 B2 | 4/2011 | Martens | |
| 7,957,462 B2 | 6/2011 | Aboujaoude | |
| 7,983,668 B2 | 7/2011 | Tiernan | |
| 8,027,390 B2 | 9/2011 | Noujeim | |
| 8,058,880 B2 | 11/2011 | Bradley | |
| 8,145,166 B2 | 3/2012 | Barber | |
| 8,156,167 B2 | 4/2012 | Bradley | |
| 8,159,208 B2 | 4/2012 | Brown | |
| 8,169,993 B2 | 5/2012 | Huang | |
| 8,185,078 B2 | 5/2012 | Martens | |
| 8,278,944 B1 | 10/2012 | Noujeim | |
| 8,294,469 B2 | 10/2012 | Bradley | |
| 8,305,115 B2 | 11/2012 | Bradley | |
| 8,306,134 B2 | 11/2012 | Martens | |
| 8,410,786 B1 | 4/2013 | Bradley | |
| 8,417,189 B2 | 4/2013 | Noujeim | |
| 8,457,187 B1 | 6/2013 | Aboujaoude | |
| 8,493,111 B1 | 7/2013 | Bradley | |
| 8,498,582 B1 | 7/2013 | Bradley | |
| 8,538,350 B2 | 9/2013 | Varjonen | |
| 8,593,158 B1 | 11/2013 | Bradley | |
| 8,629,671 B1 | 1/2014 | Bradley | |
| 8,630,591 B1 | 1/2014 | Martens | |
| 8,666,322 B1 | 3/2014 | Bradley | |
| 8,718,586 B2 | 5/2014 | Martens | |
| 8,760,148 B1 * | 6/2014 | Bradley | H04B 3/46 |
| | | | 324/76.23 |
| 8,816,672 B1 | 8/2014 | Bradley | |
| 8,816,673 B1 | 8/2014 | Barber | |
| 8,884,664 B1 | 11/2014 | Bradley | |
| 8,903,149 B1 | 12/2014 | Noujeim | |
| 8,903,324 B1 | 12/2014 | Bradley | |
| 8,942,109 B2 | 1/2015 | Dorenbosch | |
| 9,103,856 B2 | 8/2015 | Brown | |
| 9,103,873 B1 | 8/2015 | Martens | |
| 9,116,187 B1 * | 8/2015 | Owen | G01R 27/32 |
| 9,176,174 B1 | 11/2015 | Bradley | |
| 9,176,180 B1 | 11/2015 | Bradley | |
| 9,210,598 B1 | 12/2015 | Bradley | |
| 9,239,371 B1 | 1/2016 | Bradley | |
| 9,287,604 B1 | 3/2016 | Noujeim | |
| 9,331,633 B1 | 5/2016 | Robertson | |
| 9,337,941 B2 | 5/2016 | Emerson | |
| 9,366,707 B1 | 6/2016 | Bradley | |
| 9,455,792 B1 | 9/2016 | Truesdale | |
| 9,560,537 B1 | 1/2017 | Lundquist | |
| 9,571,142 B2 | 2/2017 | Huang | |
| 9,588,212 B1 | 3/2017 | Bradley | |
| 9,594,370 B1 | 3/2017 | Bradley | |
| 9,606,212 B1 | 3/2017 | Martens | |
| 9,696,403 B1 | 7/2017 | Elder-Groebe | |
| 9,733,289 B1 | 8/2017 | Bradley | |
| 9,753,071 B1 | 9/2017 | Martens | |
| 9,768,892 B1 * | 9/2017 | Bradley | H04B 17/17 |
| 9,860,054 B1 | 1/2018 | Bradley | |
| 9,964,585 B1 | 5/2018 | Bradley | |
| 9,967,085 B1 | 5/2018 | Bradley | |
| 9,977,068 B1 | 5/2018 | Bradley | |
| 10,003,453 B1 | 6/2018 | Bradley | |
| 10,006,952 B1 | 6/2018 | Bradley | |
| 10,064,317 B1 | 8/2018 | Bradley | |
| 10,116,432 B1 | 10/2018 | Bradley | |
| 2007/0159182 A1 * | 7/2007 | Bradley | G01R 27/28 |
| | | | 324/638 |
| 2008/0297172 A1 * | 12/2008 | Held | G01R 29/26 |
| | | | 324/614 |
| 2016/0033563 A1 * | 2/2016 | Needham | G01R 31/2841 |
| | | | 324/76.23 |

OTHER PUBLICATIONS

Cunha, Telmo R. et al., "Characterizing Power Amplifier Static AM/PM with Spectrum Analyzer Measurements", IEEE © 2014, 4 pages.

Fager, Christian et al., "Prediction of Smart Antenna Transmitter Characteristics Using a New Behavioral Modeling Approach" IEEE® 2014, 4 pages.

Fager, Christian et al., "Analysis of Nonlinear Distortion in Phased Array Transmitters" 2017 International Workshop on Integrated Nonlinear Microwave and Millmetre-Wave Circuits (INMMiC), Apr. 20-21, 2017, Graz, Austria, 4 pages.

Martens, J. et al., "Towards Faster, Swept, Time-Coherent Transient Network Analyzer Measurements" 86th ARFTG Conf. Dig., Dec. 2015, 4 pages.

Martens, J., "Match correction and linearity effects on wide-bandwidth modulated AM-AM and AM-PM measurements" 2016 EuMW Conf. Dig., Oct. 2016, 4 pages.

Nopchinda, Dhecha et al., "Emulation of Array Coupling Influence on RF Power Amplifiers in a Measurement Setup", IEEE © 2016, 4 pages.

Pedro, Jose Carlos et al., "On the Use of Multitone Techniques for Assessing RF Components' Intermodulation Distortion", IEEE Transactions on Microwave Theory and Techniques, vol. 47, No. 12, Dec. 1999, pp. 2393-2402.

Ribeiro, Diogo C. et al., "D-Parameters: A Novel Framework for Characterization and Behavorial Modeling of Mixed-Signal Systems", IEEE Transactions on Microwave Theory and Techniques, vol. 63, No. 10, Oct. 2015, pp. 3277-3287.

(56) References Cited

OTHER PUBLICATIONS

Roblin, Patrick, "Nonlinear RF Circuits and Nonlinear Vector Network Analyzers; Interactive Measurement and Design Techniques", The Cambridge RF and Microwave Engineering Series, Cambridge University Press © 2011, entire book.

Rusek, Fredrik et al., "Scaling Up MIMO; Opportunities and challenges with very large arrays", IEEE Signal Processing Magazine, Jan. 2013, pp. 40-60.

Senic, Damir et al., "Estimating and Reducing Uncertainty in Reverberation-Chamber Characterization at Millimeter-Wave Frequencies", IEEE Transactions on Antennas and Propagation, vol. 64, No. 7, Jul. 2016, pp, 3130-3140.

Senic, Damir et al., "Radiated Power Based on Wave Parameters at Millimeter-wave Frequencies for Integrated Wireless Devices", IEEE © 2016, 4 pages.

\* cited by examiner

FIG. 4

Equation 41
$$\overline{|b_d|^2} = \frac{1}{2}\left(\overline{|b_1|^2} + \overline{|b_2|^2}\right) - Re\overline{(b_1 \cdot b_2^*)}$$

Equation 42
$$\overline{|b_c|^2} = \frac{1}{2}\left(\overline{|b_1|^2} + \overline{|b_2|^2}\right) + Re\overline{(b_1 \cdot b_2^*)}$$

Equation 43
$$\widetilde{b_x} = \frac{b_x}{bx/a1_{cal}} \left| \frac{bx/a1_{cal}}{bx_{cal}} \right.$$

METHOD FOR DIFFERENTIAL/COMMON-MODE NOISE FIGURE MEASUREMENTS

CLAIM OF PRIORITY

This application claims the benefit of priority to U.S. Provisional Application No. 62/683,603 filed Jun. 11, 2018 titled "METHOD FOR DIFFERENTIAL/COMMON-MODE NOISE FIGURE MEASUREMENTS" which is incorporated herein by reference in its entirety.

TECHNICAL FIELD

The present invention relates generally to methods of measuring noise characteristics of a device under test (DUT) and instruments that measure noise characteristics of a DUT.

BACKGROUND

Where the DUT is a differential amplifier or similar structure the DUT has two (or more) output ports. Differential amplifiers typically have two inputs and two outputs. The two inputs are nominally driven with two signals that are the same signal but one hundred eighty degrees out of phase. Similarly the amplified outputs are the same amplified signal but one hundred eighty degrees out of phase. Differential amplifiers are useful because they consume less DC power and are also less susceptible to DC interference. However measuring the noise characteristics of differential amplifiers (or other multiport devices) is more complicated than conventional single port devices. In measuring the noise figure of a differential amplifier or similar structure, there have been commonly two approaches used in the past: Ignore noise correlation between output ports; or use a balun/combiner to create a single output noise signal and de-embed its loss. Both approaches have problems as described below.

Ignoring noise correlation between output ports enables the use of classical 2-port noise figure measurements on each of the DUT outputs independently (and results combined, usually in an averaging sense). This is easy but can result in an overestimation or underestimation of the noise figure depending on the DUT. If the DUT output stage (topologically) has independent, dominant noise generators, the error will be small. If the dominant noise generator is something like a coupled differential pair, then the noise waveforms will be highly correlated and the error could be significant. The errors are even larger when one is trying to analyze the noise from a non-dominant mode (e.g., common-mode noise on a differential amplifier). Thus ignoring noise correlation can lead to significant and variable errors in noise measurement deepening on the source and correlation pf the noise.

Using a balun/combiner to create a single output noise signal and de-embed its loss allows for measurement of the single output noise signal. If the balun/combiner is perfectly balanced, this can correctly capture the correlation effects and give correct value for differential (or common-mode or some other mode that is orthogonal to its counterpart depending on the combiner) noise power after loss de-embedding. However, it does not give the noise power for the other mode (common-mode power in the case of a balun) and will have errors if the balun/combiner is not perfectly balanced. There are ways to correct for imbalance but they require additional noise measurements with and without the balun/combiner present. Also broadband baluns are not always readily available (particularly at mm-wave frequencies). Thus use of the balun/combiner can miss certain noise measurements while also providing additional sources of error in noise measurement, and increased complexity of test procedures.

Accordingly the conventional methods for measuring the noise figure of a differential amplifier or similar structure, are problematic. Accordingly it is desirable to provide improved systems and methods for measuring noise characteristics of differential amplifiers or similar structures having two (or more) output ports. Further objects and advantages of the present invention will become apparent to those skilled in the art from the following detailed description of the various embodiments, when read in light of the accompanying drawings.

BRIEF DESCRIPTION OF THE DRAWINGS

FIG. 4 illustrates equations for calculating noise figures for a DUT based on measurements using the system of FIG. 1 according to an embodiment.

DETAILED DESCRIPTION

Figure 1:
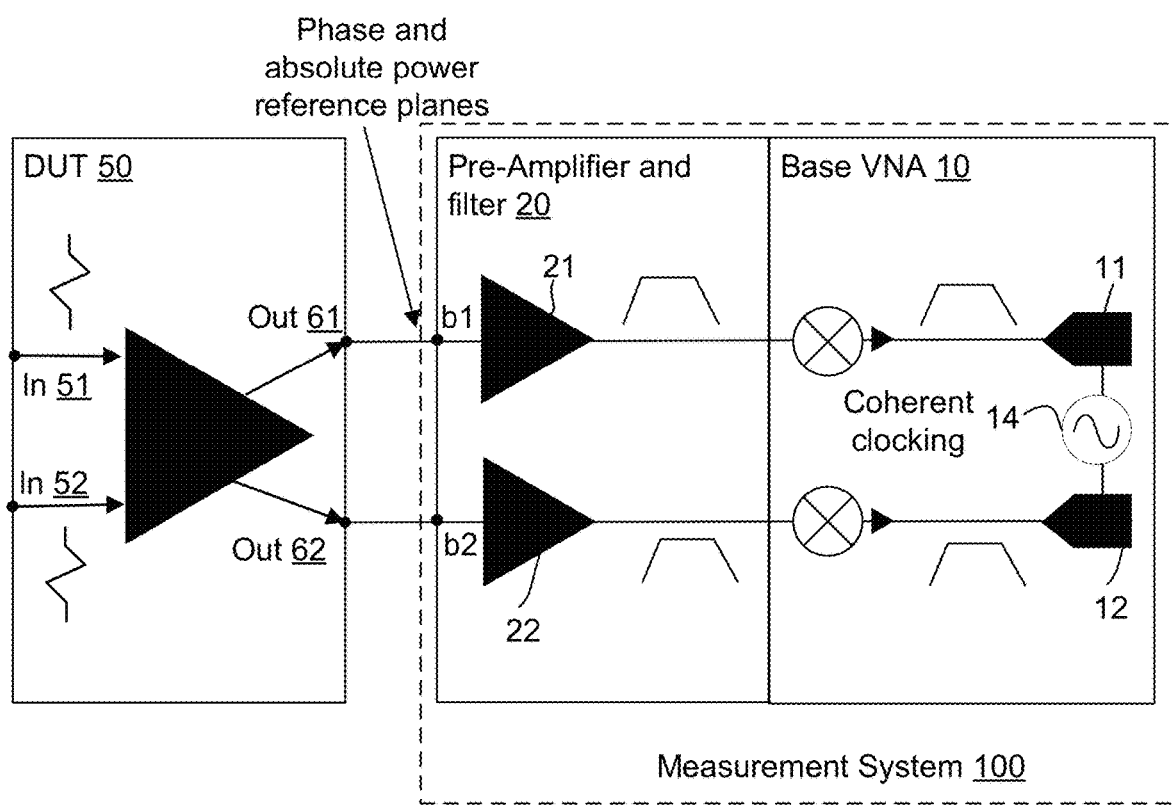
FIG. 1 is a partial circuit diagram of a measurement instrument including a pair of synchronized receivers, according to an embodiment.

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout.

In the following description, numerous specific details are set forth to provide a thorough description of the invention. However, it will be apparent to those skilled in the art that the invention may be practiced without these specific details. In other instances, well-known features have not been described in detail so as not to obscure the invention.

Embodiments of the present invention provide improved systems and methods for measuring noise characteristics of differential amplifiers or similar structures having two (or more) output ports.

Embodiments of the present invention can be applied to improve the functionality of a Vector Network Analyzer (VNA). A vector network analyzer (VNA) is a reflectometer-based electronic instrument that can be used to measure the frequency response (magnitude and phase) of a device under test (DUT) such as an electrical network, component, circuit, or sub-assembly. A VNA makes use of a frequency sweeping source or stimulus, directional couplers, and one or more receivers that provide ratioed amplitude and phase information such as reflection and transmission coefficients. In embodiments of the present invention, a VNA with multiple receivers available is used to measure noise power simultaneously on each the two ports of a differential amplifier. Because the VNA is a vector receiver, it can capture phase information for the two port of the DUT so it can analyze the vector difference between the signal at the two output ports and compute the power of that vector difference without losing phase information. The common mode noise power can also be easily analyzed from the data by measuring the vector sum instead of the vector difference.

Embodiments of the present invention can improve VNA or VNA-like measurements by adding new systems and methods of handling correlation in multiport noise figure measurements by using coherent receivers to capture the multiple noise waveforms simultaneously and in vector form so the correlation can be directly calculated. For example, devices and methods can be used in the MS464XX VNA platform developed and sold by Anritsu Company as part of its software package. The novel systems and methods of the present invention enable more accurate measurements of multiport noise in, for example, differential amplifiers, with a simpler measurement setup than prior solutions.

An embodiment contains an improved method for multiport noise figure measurement that can capture correlation effects differential and common mode noise figure without needing baluns/combiners. A better estimate of correlation between DUT outputs can be obtained. Coherent receivers allow more direct measurement of noise waveforms.

An embodiment provides handling of undesired de-correlating effects by using frequency information and a calibration that establishes a phase reference plane. The case for two DUT output ports is discussed below (and typically with two input ports terminated in noisy, reflection-less terminations for the measurement) but can be more generally applied to other multiport environments.

FIG. 1 is a partial circuit diagram of a measurement system 100 including a pair of synchronized receivers, according to an embodiment. As shown in FIG. 1, a measuring system 100 comprises a VNA 10 having (at least) two receivers 11, 22 that are synchronized to a common clock 14. The base VNA 10 is augmented with preamplifier and filters 20 for each of the two receivers. The preamplifiers and filters are used to reject conversion images and minimize the effects of nonlinearities further downstream in the receivers. The preamplifier and filter 20 is typically an attachment that that connects to the VNA 10. However the preamplifier and filter could also be integrated into a VNA system.

As shown, in FIG. 1, a differential amplifier, DUT 50, has two input ports 51, 52 and two output ports 61, 62. The output ports 61, 62 are connected to the receivers 11, 12 of the VNA 10 through the preamplifiers and filters 21, 22 of the preamplifier and filter module 20.

The receivers are used to take samples of the output of the differential amplifier for analysis. The receivers down convert the noise source signal from the DUT to an intermediate frequency (IF) range, and the IF signal is processed to provide an indication of power level enabling the noise figure to be determined over the frequency range. Unlike the prior art, the output noise waveforms are measured simultaneously in a coherent fashion (so the phase relationship can be maintained).

The two receivers of the VNA available are used to measure noise power simultaneously on each the two output ports of a differential amplifier. Because the VNA is a vector receiver, it can capture phase information for the two ports of the DUT so it can analyze the vector difference between the signal at the two output ports and compute the power of that vector difference without losing phase information. The common mode noise powers can easily analyzed from the data by measuring the vector sum instead of the vector difference.

The coherent measurement of the two waveforms is important since it allows for calculation of the differential and common-mode noise powers from the sampled signal.

The differential ($b_d$) and common mode ($b_c$) noise powers can be calculated using the equations 41 and 42 of FIG. 4. The differential mode noise power ($b_d$) can be calculated using equation 41 of FIG. 4. The common mode ($b_c$) noise power can be calculated using equation 42 of FIG. 4.

Defining the symbols used in the equations of FIG. 4, $b_d$ stands for differential power, $b_d$ stands for common mode power, $b_1$ is the noise power at the first port, $b_2$ is the noise power at the second port. And Re is the real part of and the asterisk (*) is the complex conjugate. The b1 and b2 by themselves are really just the waves at the two ports. The overbar is the mean sum, so the over bar with b1 squared is the mean squared sum of b1 squared over all these samples, and that is the noise power and the b2 overbar squared is the port two noise power. The last term is a sum of the b1 times the complex conjugate of b2, and that's a correlation term. Used in here the correlation of two signals in the signal processing world, and this is same concept.

These are the differential and common mode noise powers and the equations are show how they are related to those single ended noise powers. However, for a lot of differential amplifiers, that term is not anywhere near zero. So the differential and common mode noise powers diverge from each other.

If the waves coming out the two ports of the DUT are completely uncorrelated, then the last terms in the equations would go to zero. For a good differential or a good common mode amplifier the signals from the two ports are quite correlated, hence the last terms in the equations are not negligible.

The mean sum indicated in the last term requires that the phase information be maintained throughout the summing process. While differential and common-mode are the most common representations used, other modal combinations are possible with the only requirement that they be orthogonal.

The b1 and b2 complex waveforms are acquired directly after calibrations at the user plane that establish absolute power (desirable for all cold-source noise figure techniques) and phase (required for the alignment of waveforms here and is unique to this method). The waveforms must be normalized per the power calibration and phase-rotated per the phase calibration. One way of writing the application of correction is shown as equation 43 of FIG. 4. Where bx/a1 cal is a ratioed measurement done with a driving source (a known calibration signal source) (of low enough level so the noise receivers do not compress) and dividing by that quantity and multiplying by its absolute value is equivalent to dividing by the phase portion (expresses as exp(j*phi)). bx cal is the absolute power normalization function.

In addition de-correlation of the responses due to the receiver chains is corrected as much as possible (there is a limit in that if correlation is lost due to exceeding the correlation time of the noise source, it cannot be recovered). There is an additional power de-correlation with electrical length variance that goes as 1+cos(2*theta) where theta is a phase difference. This functional dependence can be directly de-embedded or can be removed with digital filtering.

The general method of using the system of FIG. 1 to analyze the noise figures for a multiport DUT is as follows. First set up the composite receivers. Second perform calibration of the system. Load DUT S-parameter or gain data. Connect DUT and measure.

A processor in the VNA 10 can be used for post processing of the b1 and b2 complex waveforms according to the equations 41 and 42 of FIG. 4 in order to calculate differential and common mode noise figures for the DUT. In embodiments, the VNA and VNA processor are configured to perform one or more of automatic calibration of the two receiver paths, automatic measurement of the DUT, and automatic analysis of digitized signal samples to calculate the noise figures for the common and differential modes.

Figure 2:
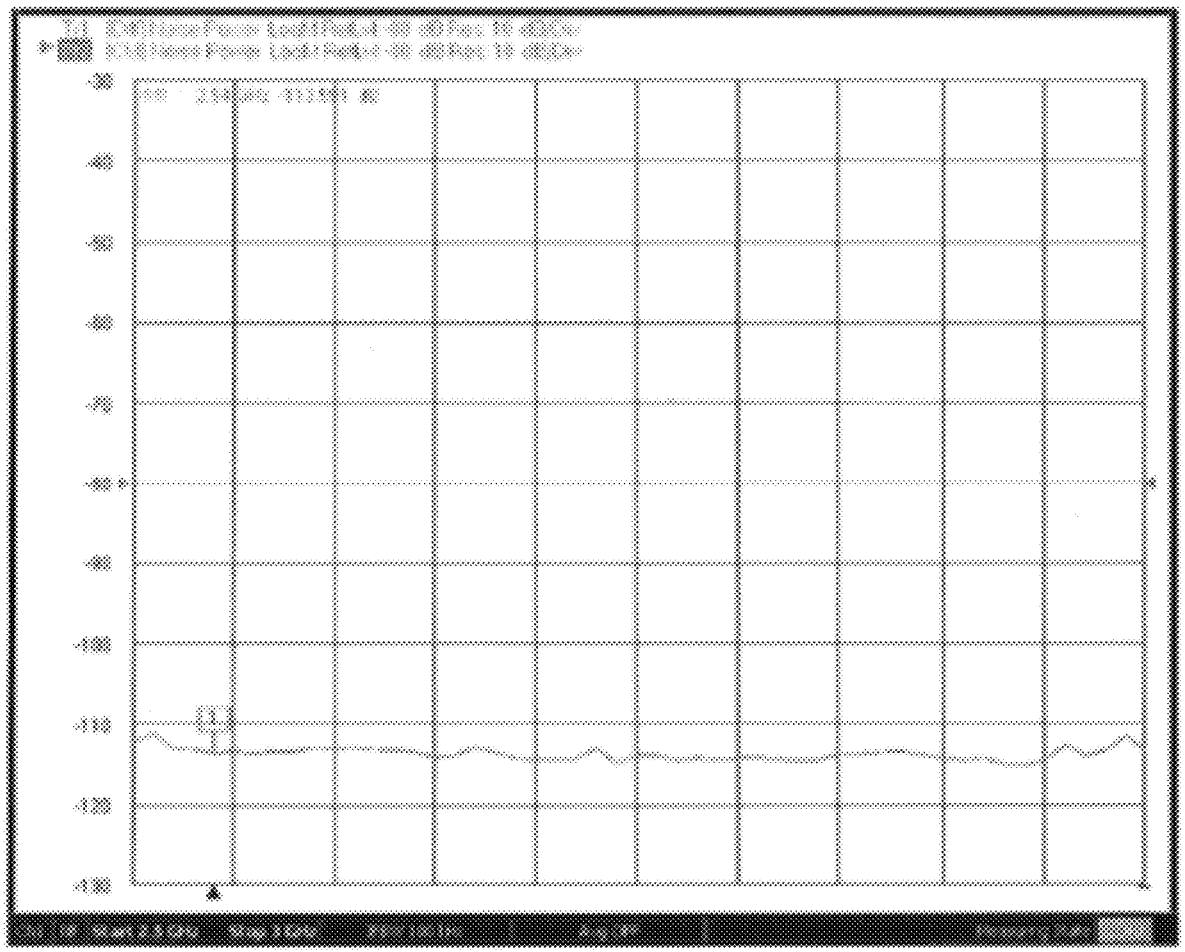
FIG. 2 illustrates example measurements of a passive device, according to an embodiment.

FIG. 2 illustrates example measurements of a passive device and show equal common-mode and differential noise power (no correlation) as would be expected.

Figure 3:
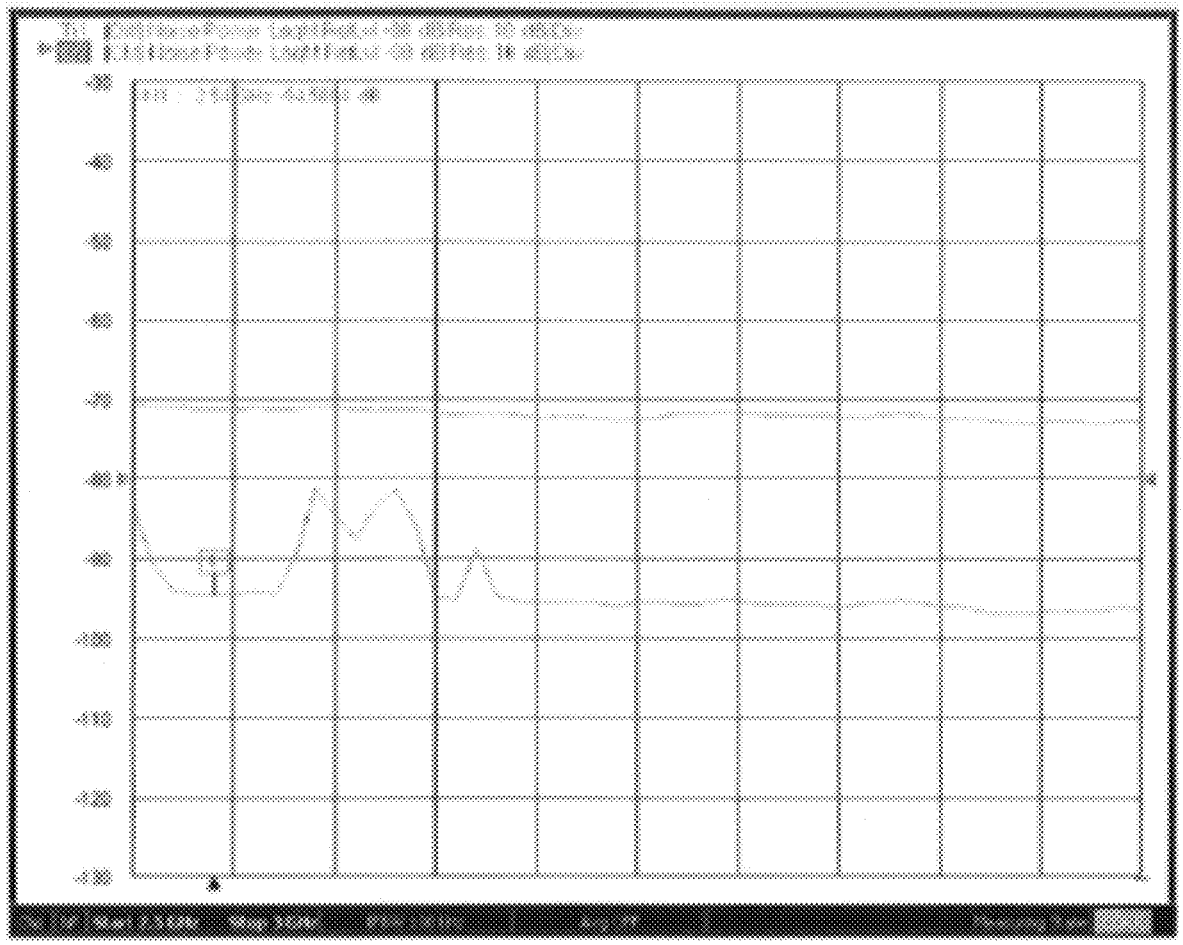
FIG. 3 illustrates further example measurements of a passive device according to an embodiment.

FIG. 3 illustrates example measurements between the two modal noise powers. A differential amplifier, on the other hand, has 10-20 dB difference between the two modal noise powers. The two modal noise powers as determined by the system of FIG. 1 and illustrated by the graph of FIG. 3 can be used to analyze the DUT, either for qualification of the part, characterization of the DUT during system integration and design, and or quality control of components.

Before taking measurements, it is preferable to calibrate the system of FIG. 1. Noise calibration, for the as with other cold-source-based methods like that described here, is done by subtracting out noise power due to the receivers of the VNA alone. Since the two receiver branches are usually disjoint, those noise powers can be processed as uncorrelated. If a coupled receiver chain is used, then correlation in the receiver must be handled as well. Equation 43 of FIG. 4 illustrates a way to calibrate the device and set up the calibration reference planes For any noise power kind of measurement like this, it is desirable to perform an absolute power calibration, The bx Cal term in that equation 43 at the bottom represent the absolute power calibration. An additional element here compared to conventional calibration is the phase correction mentioned earlier and it's his really just to make sure that the signal that b1 and b2 we pick up are now phase aligned from the receivers point of view so the we can actually tell what parts are in phase and what parts of the out of phase. And that's what the bx over al terms are used for in equation 43.

The system is calibrated using a reference receiver it's yet another receiver that. The b1 and b2 phases paths are calibrated relative to the same reference receive al. This allows for a consistent reference for measurements of the DUT. The equation 43 can then be used as a calibration correction on the incoming b1 and b2 values before the signal analysis represent by equations 41 and 42.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. A system for measuring noise characteristics of a device under test (DUT), the system comprising:
a first preamplifier and a second preamplifier;
a first receiver connected by the first preamplifier to a first port of the DUT;
a second receiver connected by the second preamplifier to a second port of the DUT;
a clock, wherein the first receiver and the second receiver are both synchronized with said clock, whereby, the second receiver is synchronized with the first receiver; and
wherein the system is configured to sample signals received from the first port of the DUT and the second port of the DUT while maintaining phase information in said signal samples; and
wherein the system is configured to characterize noise associated with the DUT from said sampled signals.

2. The system of claim 1, wherein:
the first preamplifier further comprises a first filter; and
the second preamplifier further comprises a second filter.

3. The system of claim 1, wherein the system is configured to characterize noise associated with the DUT from said sampled signals by calculating a differential mode noise figure for the DUT.

4. The system of claim 1, wherein the system is configured to characterize noise associated with the DUT from said sampled signals by calculating a common mode noise figure for the DUT.

5. The system of claim 1, wherein the system is configured to characterize noise associated with the DUT from said sampled signals by calculating a differential mode noise figure and a common mode noise figure for the DUT.

6. A system for measuring noise characteristics of a differential amplifier (DA), the system comprising:
a clock;
a first preamplifier and a second preamplifier;
a first receiver synchronized with said clock and connected by the first preamplifier to a first port of the DA;
a second receiver synchronized with said clock and connected by the second preamplifier to a second port of the DA;
wherein the system is configured to sample signals received from the first port of the DA and the second port of the DA while maintaining phase information in said signal samples; and
wherein the system is configured to characterize noise associated with the DA from said sampled signals.

7. The system of claim 6, wherein:
the first preamplifier further comprises a first filter; and
the second preamplifier further comprises a second filter.

8. The system of claim 6, wherein the system is configured to characterize noise associated with the DA from said sampled signals by calculating a differential mode noise figure for the DA.

9. The system of claim 6, wherein the system is configured to characterize noise associated with the DA from said sampled signals by calculating a common mode noise figure for the DA.

10. The system of claim 6, wherein the system is configured to characterize noise associated with the DA from said sampled signals by calculating a differential mode noise figure and a common mode noise figure for the DA.

11. The system of claim 6, wherein the system is configured to calibrate the first receiver and the second receiver by subtracting out noise power due to the first receiver and the second receiver prior to sampling signals from the DA.

12. The system of claim 1, wherein the system is configured to calibrate the first receiver and the second receiver by subtracting out noise power due to the first receiver and the second receiver prior to sampling signals from the DUT.

13. A method for measuring noise characteristics of a device under test (DUT), the method comprising:
- providing a vector network analyzer (VNA) comprising a first receiver, a second receiver, a first preamplifier, a second preamplifier and a clock;
- synchronizing the first preamplifier and the second preamplifier with the clock whereby the second preamplifier is synchronized with the first preamplifier;
- connecting the first receiver to a first port of the DUT through the first preamplifier;
- connecting the second receiver connected to a second port of the DUT though the second preamplifier;
- sampling signals received from the first port of the DUT using the first receiver to create first signal samples;
- sampling signals received from the second port of the DUT using the second receiver to create second signal samples;
- maintaining phase information in said first signal samples and second signal samples; and
- characterizing noise associated with the DUT from said first signal samples and second signal samples.

14. The method of claim 13, wherein characterizing noise associated with the DUT from said first signal samples and second signal samples comprises calculating a differential mode noise figure for the DUT from said first signal samples and second signal samples.

15. The method of claim 13, wherein characterizing noise associated with the DUT from said first signal samples and second signal samples comprises calculating a common mode noise figure for the DUT from said first signal samples and second signal samples.

16. The method of claim 13, wherein characterizing noise associated with the DUT from said first signal samples and second signal samples comprises calculating a differential mode noise figure and a common mode noise figure for the DUT from said first signal samples and second signal samples.

17. The method of claim 13, further comprising: calibrating the first receiver and second receiver prior to sampling signals from the DUT.

18. The method of claim 13, further comprising, prior to sampling signals from the DUT:
- calibrating the first receiver and second receiver; and
- loading S-parameter data for the DUT.

19. The method of claim 13, further comprising, prior to sampling signals from the DUT:
- calibrating the first receiver and second receiver; and
- loading gain data for the DUT.

20. The method of claim 13, further comprising, prior to sampling signals from the DUT, calibrating the first receiver and second receiver by subtracting out noise power due to the first and second receivers of the receivers of the VNA.

* * * * *